US005617092A

United States Patent [19]
Pace

[11] Patent Number: 5,617,092
[45] Date of Patent: Apr. 1, 1997

[54] HIGH RESOLUTION ENCODING CIRCUIT AND PROCESS FOR ANALOG TO DIGITAL CONVERSION

[75] Inventor: Phillip E. Pace, Castroville, Calif.

[73] Assignee: The United States of America as represented by the Secretary of the Navy, Washington, D.C.

[21] Appl. No.: 395,331

[22] Filed: Feb. 28, 1995

[51] Int. Cl.$^6$ ................................................... H03M 1/14
[52] U.S. Cl. ........................... 341/159; 341/155; 341/160
[58] Field of Search ..................................... 341/155, 159, 341/160–172

[56] References Cited

U.S. PATENT DOCUMENTS

| | | | |
|---|---|---|---|
| 4,584,563 | 4/1986 | Bernardson | 340/347 |
| 5,376,937 | 12/1994 | Colleran et al. | 341/159 |
| 5,392,045 | 2/1995 | Yee | 341/156 |

OTHER PUBLICATIONS

High Resolution Encoding Process for an Integrated Optical A/D Converter Aug. 1994 Phillip E Pace, David Styer.
P.E. Pace et al., High–Resolution Encoding Process for an Integrated Optical Analog–To–Digital Converter, Optical Engineering, vol. 33, No. 8 (Aug., 1994).

Primary Examiner—Jeffrey A. Gaffin
Assistant Examiner—Peguy JeanPierre
Attorney, Agent, or Firm—Thomas E. McDonnell; Edward F. Miles

[57] ABSTRACT

An analog-to-digital converter in which an analog input signal is folded by a plurality of folding circuits whose moduli, and hence half folding periods, are mutually prime with respect to one another. Each folding circuit has an associated comparator ladder having one less comparator than the modulus of the folding circuit. The collective output of the ladders, i.e. the states of the comparators in the ladders, uniquely corresponds to input signal magnitude over a dynamic range equal to the product of the folding circuits' moduli, permitting a greater dynamic range for the converter for the number of comparators used.

7 Claims, 5 Drawing Sheets

# 5,617,092

HIGH RESOLUTION ENCODING CIRCUIT AND PROCESS FOR ANALOG TO DIGITAL CONVERSION

BACKGROUND OF THE INVENTION

High performance analog to digital converters typically employ a parallel configuration of analog folding circuits to symmetrically fold input signals prior to quantization by high-speed comparators. Such a circuit uses two comparator ladders, having a total of $2(2^{n/2}-1)$ comparators in the two legs together, where n is the bit resolution of the converter. The comparator ladder in each leg performs an n/2 bit binary encoding of the analog input. Because the number of levels depends exponentially on n, the number of comparators which one must employ rises exponentially with circuit resolution. This can make many engineering applications of such circuits expensive. Moreover, skew time—the time lag between receipt of analog input and delivery of quantized output—increases with increasing number of comparators; and as the number of comparators increases, the power they consume does also, leaving less system power available for signal detection, thus reducing system bandwidth.

SUMMARY OF THE INVENTION

Accordingly, an object of the invention is to increase the bit resolution per comparator in analog-to-digital converters significantly beyond that which is currently available.

Another object is to reduce the skew time in such circuits by reducing the number of comparators necessary for a given circuit bit resolution.

Another object is to decrease the power consumption of such circuits, and increase circuit bandwidth, by reducing the total number of comparators necessary for a given circuit resolution.

In accordance with these and other objects made apparent hereinafter, the invention concerns an analog to digital converter having N folding circuits, N being a positive, non-zero, integer greater than or equal to 2, which receive an analog input. Each of the folding circuits has an associated integer modulus $m_n$, n=1, ..., N, each of which moduli are relatively prime with respect to one another, and folds the input in accordance with a preselected folding function whose folding period is $2m_n$.

The output of the folding circuits, when detected by an associated comparator ladder having as few as $m_n-1$ comparators per ladder, provide a digital output which uniquely corresponds to the amplitude of the analog input, with a dynamic range equal to the product of the moduli. Because the total number of comparators needed to detect the folding circuits' outputs are on the order of the sum of the moduli, the larger the moduli, the larger the ratio of dynamic range to the number of required comparators. One can implement the invention with relatively low power comparators, and still convert relatively high power analog signals.

These and other objects, features, and advantages of the invention are further understood from the following detailed description of particular embodiments. It is understood, however, that the invention is capable of extended application beyond the precise details of these embodiments. Changes and modifications can be made to the embodiments that do not affect the spirit of the invention, nor exceed its scope, as expressed in the appended claims. The embodiments are described with particular reference to the accompanying drawings, wherein:

DETAILED DESCRIPTION

Figure 1:
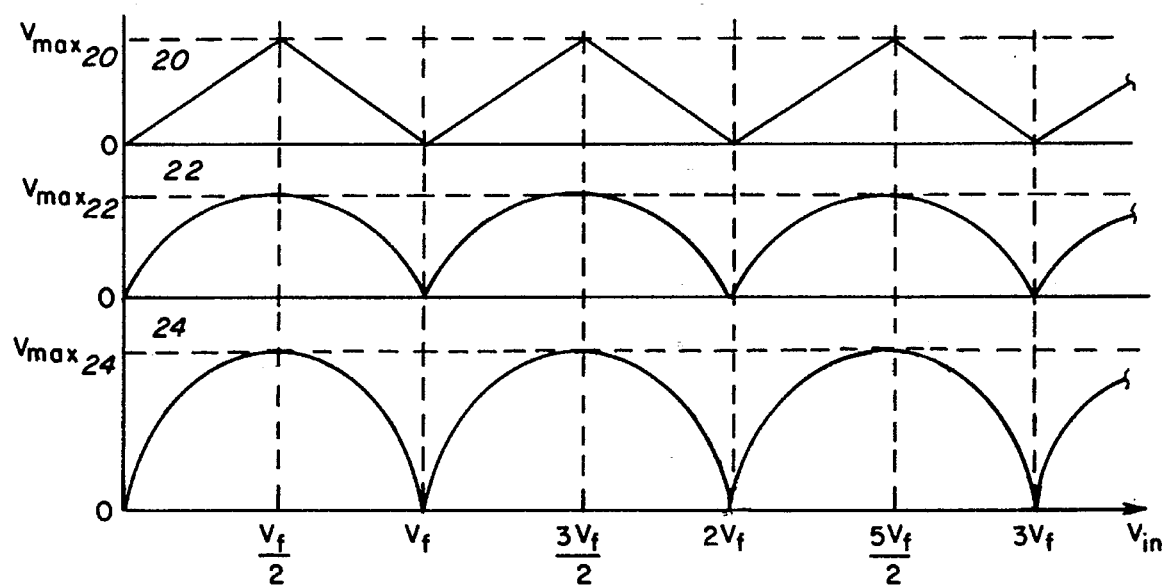
FIG. 1 is a graph illustrating the notion of folded waveforms.

With particular reference to the drawing figures, FIG. 1 shows three exemplary waveforms as functions of input signal $v_{in}$, to illustrate the notion of folded waveforms. A folded waveform is a signal, generated responsive to a monotonically increasing input (here, $v_{in}$), which periodically increases and decreases between maximum and minimum levels with monotonically increasing input. The waveforms are even functions, i.e. mirror image symmetrical about the vertical axis in FIG. 1. Waveform 20 is a triangular folded signal, waveform 22 is a rectified sinusoidal folded signal, and waveform 24 is a sinusoidal squared folded signal. The range of input magnitude over which such a folded signal repeats is the folding period $v_f$.

Figure 2:
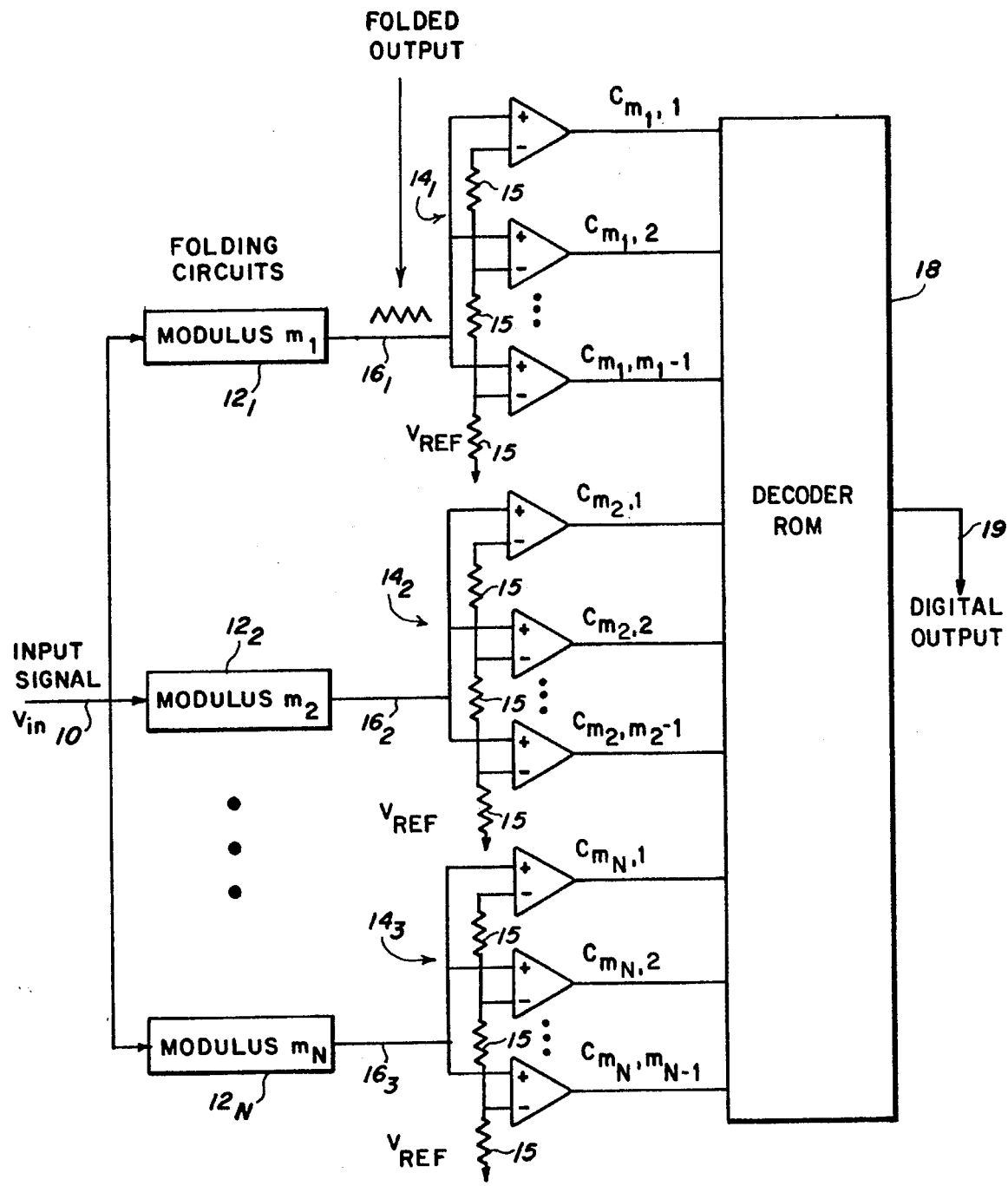
FIG. 2 is an electronic schematic showing a circuit according to an embodiment of the invention.

FIG. 2 shows a circuit according to the invention, having an input signal $v_{in}$ 10 fed in parallel to N folding circuits $12_n$, n=1, 2, ..., N, N≧2. Each folding circuit 12 has a different integer modulus $m_n$, the meaning of which is discussed below in reference to FIG. 3. Each circuit 12 folds input 10 in accordance with a preselected folding function. Circuits to perform folding are known, and folding circuits per se form no part of this invention. The folding period of each circuit 12 is $2m_n$, i.e. $v_{f(m_n)}=2m_n$, where $v_{f(m_n)}$ is the folding period of the circuit $12_n$ having modulus $m_n$. The N moduli are relatively prime with respect to one another, i.e. no modulus has any common factor with any other of the moduli (other than 1). The N folding circuits 12 transform input signal 10 into N corresponding folded outputs which respective lines $16_1$, $16_2$, ..., $16_N$ direct to respective detector ladders $14_1$, $14_2$, ..., $14_N$. Each ladder 14 is composed of $m_n-1$ signal comparators, or level detectors, $C_{m_n,1}$, $C_{m_n,2}$, ..., $C_{m_n,m_n}-1$. ($C_{m_n,m_n}-1$ means the $m_n-1$th comparator of the nth ladder, the nth ladder being fed the output of a folding circuit of modulus $m_n$.) Detectors C are preferably differential amplifiers, such as operational amplifiers, biased via potentiometers 15 to trigger (change state) at appropriate input signal levels. However, detectors C could be any conventional difference amplifier, or simple diodes which are back biased at desired trigger signal levels. Output from each level detector C in signal ladders 14 is fed to decoder 18, which determines from the states of detectors C (i.e. on or off) what the magnitude of input $v_{in}$ is, and outputs this magnitude via line 19 in digital form. The manner in which this is done is discussed below with reference to FIGS. 3 ff. Preferably, decoder 18 is a read only memory (ROM) programmed with the truth table relating comparator input states to the magnitude of $v_{in}$, but more broadly could be any logical device effective to interpret a digital input and translate it according to a preset logical rule into a corresponding output.

Trigger biases of the comparators of FIG. 2 are set via potentiometer 15 so that comparators in each leg trigger at constant increments of input signal $v_{in}$. Thus, for example, in ladder 14 fed by an input from folding circuit 12 having modulus $m_n$, comparators $C_{m_n,l}$, $l=1, 2, \ldots, m_n-1$, trigger at corresponding intervals $v_{t(n,l)}=l\Delta v$, i.e. $\Delta v$, $2\Delta$, $\ldots$, $(m_n-1)\Delta v$ respectively, where $\Delta v$ is the least significant bit, typically in volts. Because of the symmetry of the folding functions dictated by circuits 12, and because the folding period of each folding function is $2m_n$, if the origins of $v_{in}$ and the outputs of the folding circuits are registered (outputs of all N folding circuits 12 are zero for $v_{in}=0$), $v_{in}=m_n\Delta v$ corresponds to the maximum output of each folding circuit, and $v_{in}=2m_n\Delta v$ corresponds to the minimum output of each folding circuit. A further consequence is that input levels $v_t$ align from ladder to ladder, i.e. $v_{t(1,1)}=v_{t(2,1)}=\cdots=v_{t(N,1)}=\Delta v$, $v_{t(1,2)}=v_{t(2,2)}=\ldots, v_{t(N,2)}=2\Delta v$, etc., with specific exceptions discussed below concerning the maxima and minima of the folding function.

Figure 3:
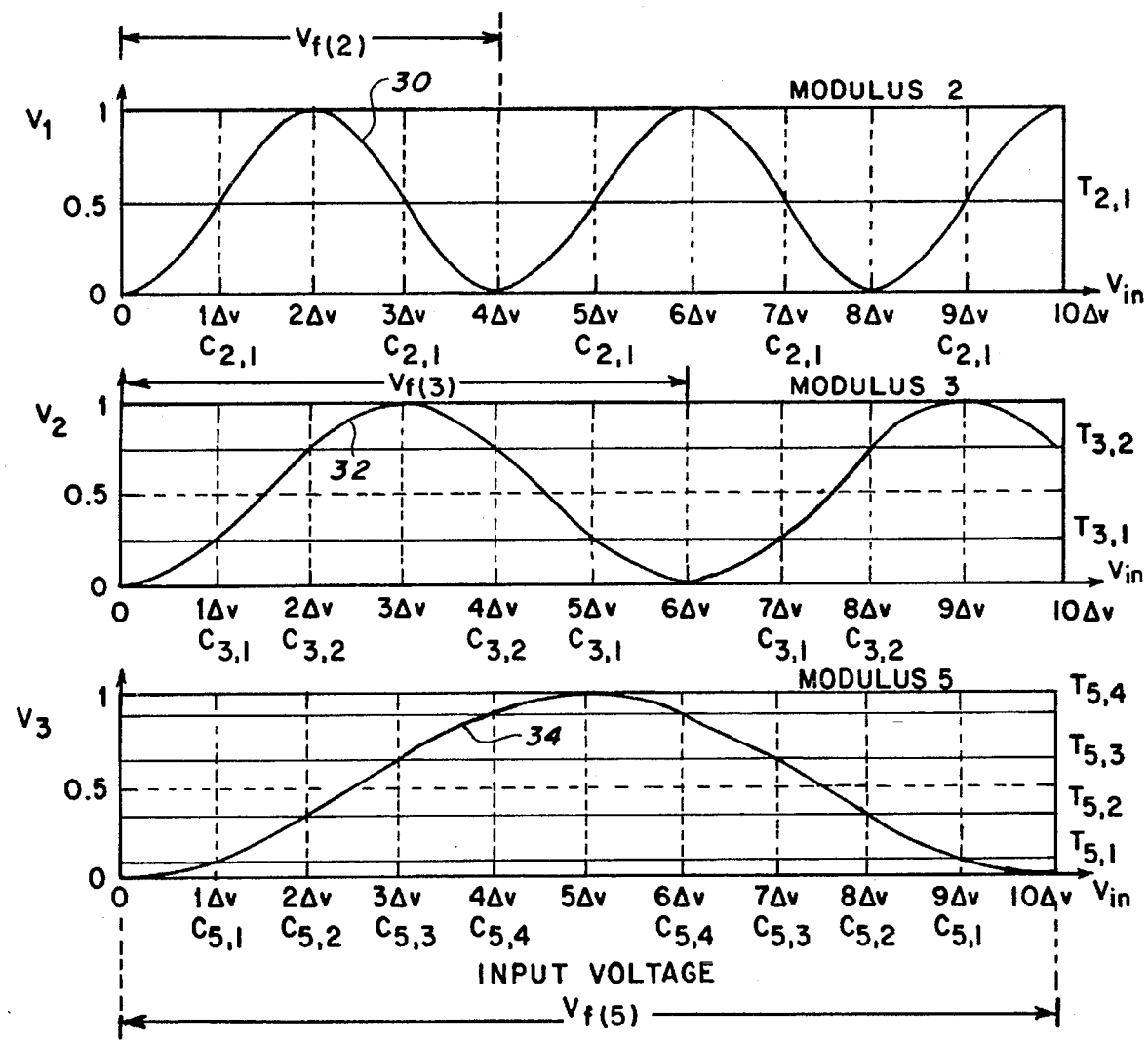
FIG. 3 is a graph illustrating the interrelationships of folded waveforms generated by the circuit of FIG. 1.

FIG. 3 illustrates motivation for, and the advantages of, this scheme, and in particular shows the folded outputs 30, 32, and 34, of a circuit like that of FIG. 2, having three folding circuits of moduli 2, 3, and 5, i.e. $N=3$, $m_1=2$, $m_2=3$, and $m_3=5$. As above, the folding period of each is $v_{f(m_n)}=2m_n\Delta v$. Thus for modulus 2, the folding period is $4\Delta v$, for modulus 3 the period is $6\Delta v$, and for modulus 5 the period is $10\Delta v$, which one can see also by inspection of FIG. 3. The comparator tree associated with each modulus has $m_n-1$ comparators $C_{m_n,l}$ $l=1\ldots, m_n-1$, biased to trigger at $v_{in}=l\Delta v$. Thus modulus 2 has but one comparator, $C_{2,1}$, biased to trigger at $v_{in}=(1)\Delta v$, with the corresponding potentiometer bias $T_{m_n,l}=T_{2,1}$ indicated on FIG. 3; modulus 3 has two comparators $C_{3,1}$ and $C_{3,2}$, biased to trigger at $v_{in}=\Delta v$ and $2\Delta v$ respectively, corresponding to biases $T_{3,1}$ and $T_{3,2}$; modulus 5 has four comparators, $C_{5,1}$, $C_{5,2}$, $C_{5,3}$, and $C_{5,4}$, with corresponding potentiometer biases $T_{5,1}$, $T_{5,2}$, $T_{5,3}$, $T_{5,4}$ set to cause the comparators to trigger at $\Delta v$, $2\Delta v$, $3\Delta v$, and $4\Delta v$ respectively. (For convenience, on FIG. 3 specific system comparators are listed below the value of $v_{in}$ at which they are biased to trigger, e.g. $C_{2,1}$ with $1\Delta v$, $C_{5,4}$ with $4\Delta v$, etc.). Because of the periodic nature of folded outputs 30, 32, 34, the comparators will trigger repeatedly at fixed periods: thus e.g. $C_{2,1}$ triggers at $\Delta v$, $3\Delta v$, $5\Delta v$, etc.; $C_{3,2}$ triggers at $2\Delta v$, $4\Delta v$, $8\Delta v$, etc.; $C_{5,1}$ triggers at $\Delta v$, $9\Delta v$, etc. The only increments of $\Delta v$ at which no comparator triggering in each modulus occurs is at the peaks and troughs of folded waveforms 30, 32, 34, which occur for each modulus at $km_n\Delta v$, $k=0, 1, 2, \ldots, \infty$, e.g. for modulus 2 ($m_n=2$), 0, $2\Delta v$, $4\Delta v$, $6\Delta v$ etc.; for modulus 3, 0, $3\Delta v$, $6\Delta v$, etc.; for modulus 5, 0, $5\Delta v$, $10\Delta v$, etc. The peaks and troughs of the folded input for one leg will align with level transitions of the other legs.

The truth table for this scheme is as follows:

| Normalized Input | Modulus 2 | Modulus 3 | Modulus 5 |
| --- | --- | --- | --- |
| 0 | 0 | 0 | 0 |
| 1 | 1 | 1 | 1 |
| 2 | 1 | 2 | 2 |
| 3 | 0 | 2 | 3 |
| 4 | 0 | 1 | 4 |
| 5 | 1 | 0 | 4 |
| 6 | 1 | 0 | 3 |
| 7 | 0 | 1 | 2 |
| 8 | 0 | 2 | 1 |
| 9 | 1 | 2 | 0 |
| 10 | 1 | 1 | 0 |
| 11 | 0 | 0 | 1 |
| 12 | 0 | 0 | 2 |
| 13 | 1 | 1 | 3 |
| 14 | 1 | 2 | 4 |
| 15 | 0 | 2 | 4 |
| 16 | 0 | 1 | 3 |
| 17 | 1 | 0 | 2 |
| 18 | 1 | 0 | 1 |
| 19 | 0 | 1 | 0 |
| 20 | 0 | 2 | 0 |
| 21 | 1 | 2 | 1 |
| 22 | 1 | 1 | 2 |
| 23 | 0 | 0 | 3 |
| 24 | 0 | 0 | 4 |
| 25 | 1 | 1 | 4 |
| 26 | 1 | 2 | 3 |
| 27 | 0 | 2 | 2 |
| 28 | 0 | 1 | 1 |
| 29 | 1 | 0 | 0 |
| 30 | 1 | 0 | 0 |
| 31 | 0 | 1 | 1 |
| 32 | 0 | 2 | 2 |
| 33 | 1 | 2 | 3 |
| 34 | 1 | 1 | 4 |
| 35 | 0 | 0 | 4 | where the "Normalized Input" is $v_{in}$ normalized to $\Delta v$ (and rounded off to the next lower integer), and "Modulus 2, 3, 5" represent the three legs of FIG. 2. Integer values in the three columns under "Modulus" represent the number of comparators in the "ON" state in each leg for a given input signal level. Thus, for $v_{in}$ between $5\Delta v$ and $6\Delta v$, the level number is 5, and the comparator ladder for modulus 2 would have one comparator in the "ON" state, the ladder for modulus 3 would have zero comparators in the "ON" state, and the ladder for modulus 5 would have four comparators in the "ON" state. Inspection of the truth table reveals that the combination of comparators in the "ON" state does not repeat until level number 30, at which point the combinations repeat in reverse order. Thus the combinations of comparators in the "ON" state uniquely and unambiguously correspond to increments in the amplitude of $v_{in}$. Stated more conventionally, the dynamic range of the circuit is thirty quantization levels. Not coincidentally, this is the product of the moduli for the three folding circuits. Because the moduli are prime with respect to one another, and the folding periods of each folding function are proportional to that function's modulus, the folding functions cannot repeat the same phase relationship with respect to one another in less than a span of $\Delta v$ times the product of the moduli. The number of comparators necessary to implement this circuit, however, is only 7, i.e. $\Sigma_n(m_n-1)=\Sigma_n m_n-N=10-3=7$, considerably less than the thirty which one would need to implement a conventional flash analog to digital converter of equal dynamic range. More generally, the dynamic range of the circuit of FIG. 2 is the product of the moduli of the its N folding circuits times $\Delta v$, the number of comparators necessary to implement the circuit is $\Sigma_n(m_n-1)$, and the number of comparators necessary to do this will always be less khan the number of input signal levels which can be resolved.

Figure 4:
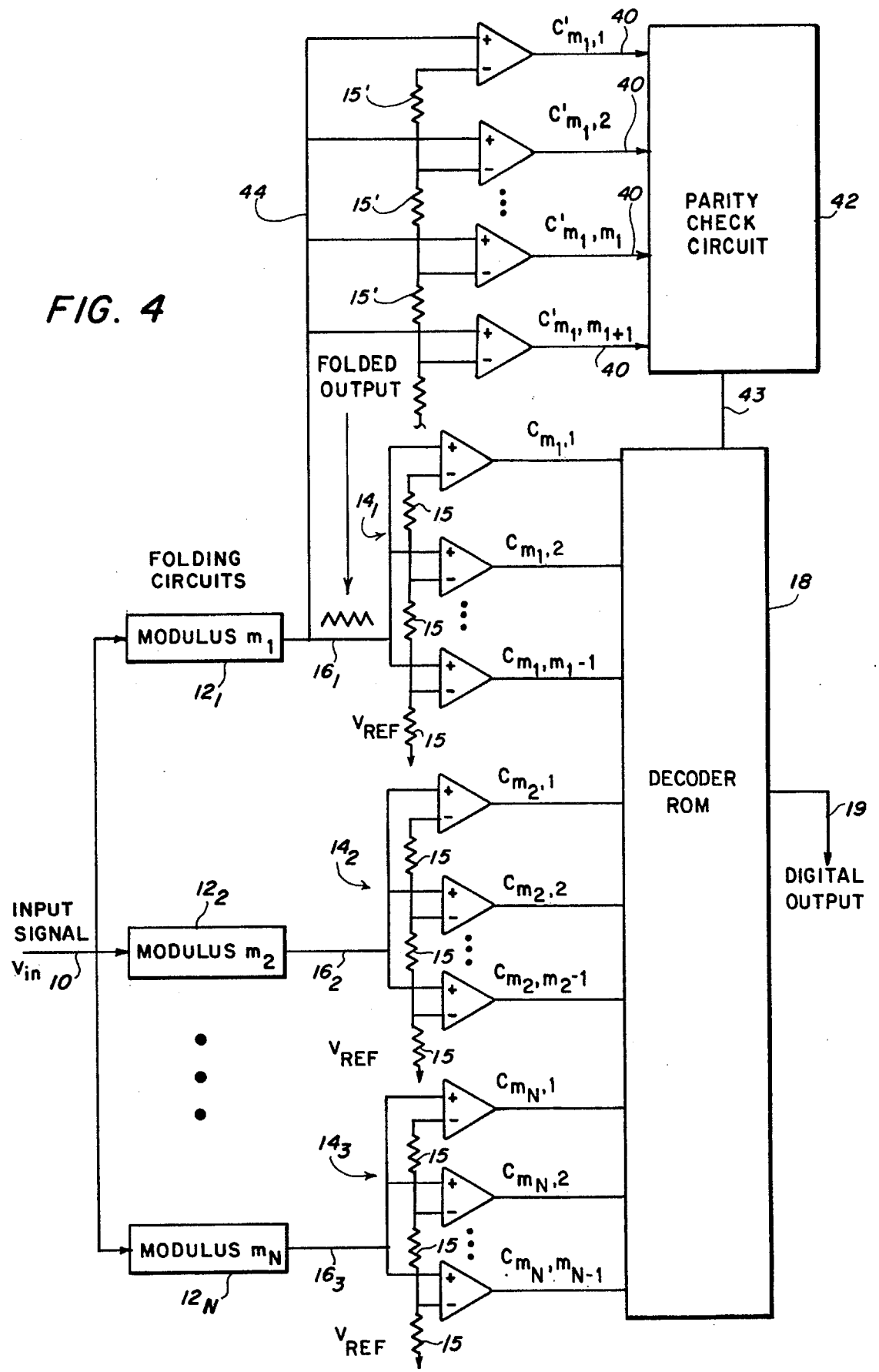
FIG. 4 shows another embodiment of the invention.

A source of error in the circuit of FIG. 2, or in any circuit employing comparators, is an input signal whose magnitude lies near a trigger point of one or more comparators. Circuit elements will have small performance discrepancies among components, which inevitably result in small variances in the triggering of individual comparators. The circuit of FIG. 2 requires triggering of a comparator in each of several legs simultaneously each time input signal $v_{in}$ crosses $1\Delta v$, for any 1. In FIG. 3, for example, as $v_{in}$ crosses $2\Delta v$, comparators $C_{3,2}$ and $C_{5,2}$ should trigger to the "ON" state simultaneously. However, if the parameters or biasing of comparators $C_{3,2}$ and $C_{5,2}$ vary slightly, a magnitude of $v_{in}$ very close to $2\Delta v$ could result in one of the comparators being triggered on, and one not, the result of which is that the code output to decoder 18 is wrong, resulting in a large output error. It is thus desirable that data resulting from an input near a comparator transition be discarded. The circuit of FIG. 4 does this. This circuit is identical to that of FIG. 2, but has associated with the comparator ladder for n=1 an additional set of $m_1+1$ comparators $C'_{m_1,p}$, p=1, ..., $m_1+1$. (Please see, e.g., FIG. 5, the response curve of modulus 2.) These $2m_1$ comparators are deployed as follows: $m_1-1$ of them are paired with respective ones of the original $m_1-1$ comparators in comparator ladder $14_1$, and biasing potentiometer 15, 15' set so that one comparator in each pair will trigger just below a desired transition point, and the other just above it. By deploying the comparators in this manner, one effectively brackets each code transition point in the dynamic range of the system.

Figure 5:
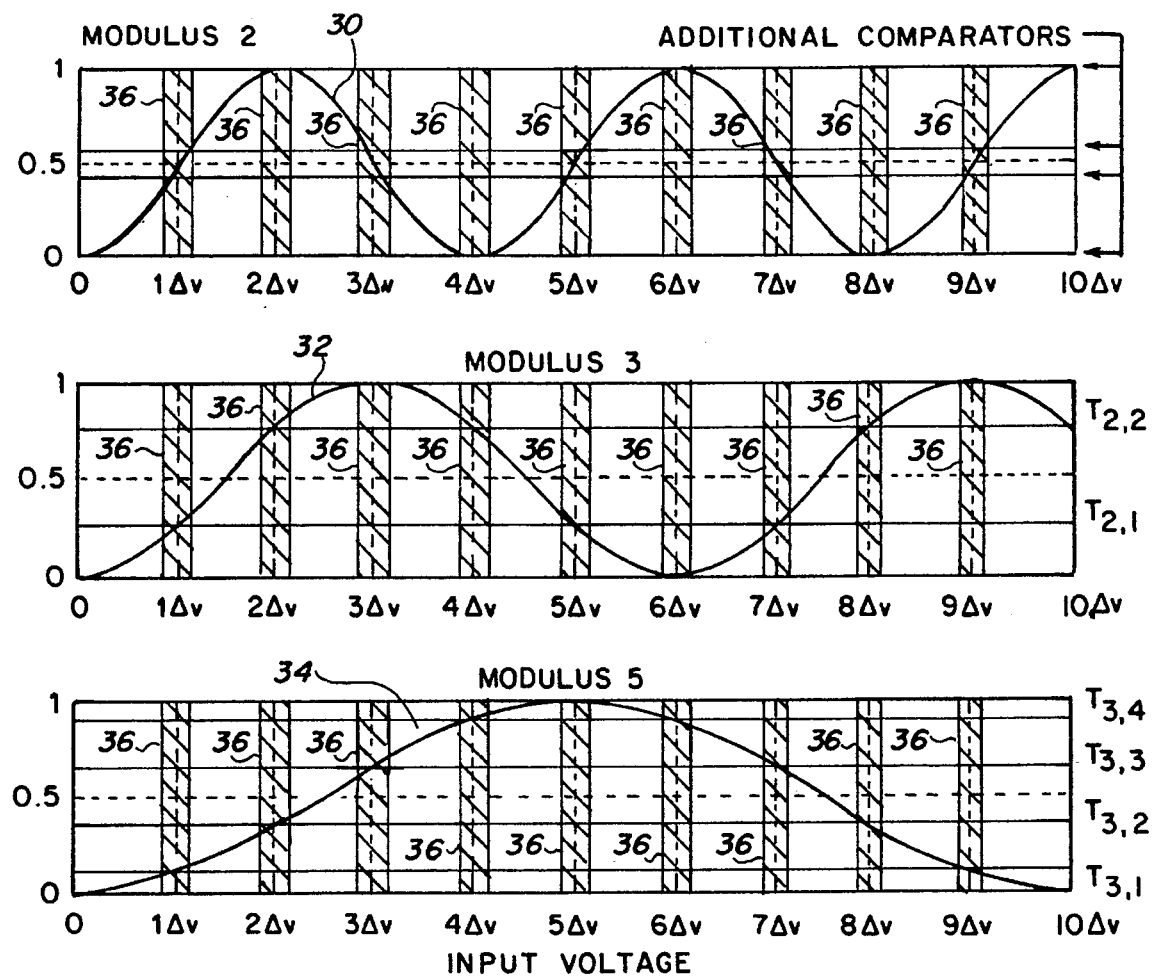
FIG. 5 is a graph, similar to that of FIG. 3, illustrating additional features of the embodiment of FIG. 4.

As an illustration, the original comparator threshold level for $m_1=2$ in FIG. 3 is replaced by two threshold levels (one slightly above the original threshold level, and one slightly below, to bracket decimation bands 36 at $1\Delta v$, $3\Delta v$, $5\Delta v$, etc.) as shown in FIG. 5. Also shown are the remaining two threshold levels, one just below the maximum (at $2\Delta v$, $6\Delta v$, etc.), and one just below the minimum (at $4\Delta v$, $8\Delta v$, etc.) to form decimation bands 36 disposed about the maxima and minima of folded waveform 30. In this manner each level transition, i.e. each increment of $\Delta v$ in $v_{in}$ is bracketed by a pair of comparators, throughout the entire dynamic range of the circuit.

In practice, the comparators in each pair are biased to ensure a triggering difference in $v_{in}$ between them larger than any anticipated drift or offset due to component imperfections, etc. This triggering difference, or bracket width, is indicated by numeral 36 in FIG. 5. Parity check circuit 42 reads the states of these $2m_1$ comparators to determine whether an even or odd number of them are "ON." For an input signal outside any of brackets 36, i.e. distant from any level transition, but above zero, the comparator associated with the signal trough will be "ON." As $v_{in}$ passes among the transition levels, so long as $v_{in}$ is outside any decimation band 36, each pair of comparators associated with the various transition levels will have the same state, either on or off, and the total number of on-comparators will be odd. Upon $v_{in}$ entering a decimation band 36, the lower biased comparator associated with the band triggers, but the higher biased comparator still remains off. Circuit 42 identifies the change in parity from odd to even, and suppresses data transmission, e.g. discards the current data point.

As just discussed, one can implement this parity checking scheme with any comparator ladder 14. Preferably one will do so with the ladder corresponding to smallest circuit modulus, to minimize the number of comparators in the circuit.

The invention has been described in what is considered to be the most practical and preferred embodiments. It is recognized, however, that obvious modifications to these embodiments may occur to those with skill in this art. Accordingly, the scope of the invention is to be discerned from reference to the appended claims, wherein:

I claim:

1. An analog to digital converter comprising:

means for receiving an input;

means for directing said input to N folding circuits, said N being an integer greater than or equal to 2, each of said N folding circuits being effective for folding said input in accordance with a corresponding N preselected folding functions, each of said folding circuits having an associated integer modulus $m_n$, n=1, ..., N;

wherein the folding period of each of said folding circuits is $2m_n$; and all moduli $m_n$ are relatively prime with respect to one another.

2. The analog to digital converter of claim 1, wherein said converter further comprises:

N comparator ladders, each of said ladders operatively connected to the output of a respective one of said folding circuits; and means for detecting the output state of each comparator in each said comparator ladder.

3. The analog to digital converter of claim 2, wherein the number of comparators in the nth of said comparator ladders is at least $m_n-1$.

4. The analog to digital converter of claim 3, wherein:

comparators in each said ladder are numbered l=1, ..., $m_n-1$, and biased effective to cause the lth comparator in each of said ladders to trigger at substantially the same amplitude of input signal.

5. The analog to digital converter of claim 3, wherein:

at least one of said ladders comprises $m_n+1$ additional comparators, $m_n-1$ respective ones of said additional comparators being paired with respective ones of said at least one of said comparator ladders to form a plurality of comparator pairs; and wherein one comparator in each of said pairs is biased to trigger at an input signal amplitude smaller than that of the other comparator of said comparator pair;

wherein one of said additional comparators is biased to trigger at about the signal minimum of the nth of said folding functions, and one of said additional comparators is biased to trigger at about the signal peak of the nth of said folding functions.

6. The analog to digital converter of claim 5, wherein said at least one of said ladders is the one of said N comparator ladders associated with the folding circuit having the smallest $m_n$.

7. The analog to digital converter of claim 5, further comprising a parity checking circuit operatively connected to receive the output of said additional comparators and said comparators of said at least one of said comparator ladders, said parity checking circuit being effective, responsive to said output, to determine whether the total number of said comparators and said additional comparators is odd or even.

* * * * *